(12) United States Patent
Moosburger et al.

(10) Patent No.: US 9,966,370 B2
(45) Date of Patent: May 8, 2018

(54) METHOD FOR PRODUCING OPTOELECTRONIC SEMICONDUCTOR DEVICES

(71) Applicant: OSRAM Opto Semiconductors Gmbh, Regensburg (DE)

(72) Inventors: Jürgen Moosburger, Lappersdorf (DE); Markus Pindl, Tegernheim (DE); Simon Jerebic, Tegernheim (DE); Frank Singer, Regenstauf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days. days.

(21) Appl. No.: 15/036,794

(22) PCT Filed: Oct. 23, 2014

(86) PCT No.: PCT/EP2014/072775
§ 371 (c)(1),
(2) Date: May 13, 2016

(87) PCT Pub. No.: WO2015/074824
PCT Pub. Date: May 28, 2015

(65) Prior Publication Data
US 2016/0284679 A1  Sep. 29, 2016

(30) Foreign Application Priority Data
Nov. 21, 2013  (DE) .................... 10 2013 112 886

(51) Int. Cl.
*H01L 33/48* (2010.01)
*H01L 25/00* (2006.01)
(Continued)

(52) U.S. Cl.
CPC .............. *H01L 25/50* (2013.01); *H01L 33/46* (2013.01); *H01L 33/483* (2013.01); *H01L 33/60* (2013.01);
(Continued)

(58) Field of Classification Search
CPC ...................................................... H01L 33/60
See application file for complete search history.

(56) References Cited

U.S. PATENT DOCUMENTS 8,236,582 B2  8/2012  Neff et al.
8,735,928 B2  5/2014  Jäger et al.
(Continued)

FOREIGN PATENT DOCUMENTS

CN  102439739 A  5/2012
CN  102473814 A  5/2012
(Continued)

OTHER PUBLICATIONS

Wang, Y.Q. et al., "Reflection Reducing Coating Composed of TiO2—SiO2 Multilayer Films Prepared using Sol-Gel Processing," Acta Photonica Sinica, vol. 37, No. 6, Jun. 30, 2008, 4 pages.

*Primary Examiner* — Thao P Le
(74) *Attorney, Agent, or Firm* — Slater Matsil, LLP

(57) ABSTRACT

A method for producing a plurality of optoelectronic semiconductor devices is provided. A number of semiconductor chips are fastened on an auxiliary support. The semiconductor chips are spaced apart from one another in a lateral direction. A reflective layer is formed, at least in regions between the semiconductor chips. A composite package body is formed at least in certain regions between the semiconductor chips. The auxiliary support is removed and the composite housing body is separated into a number of optoelectronic semiconductor devices. Each optoelectronic semiconductor device has at least one semiconductor chip, (Continued)

part of the reflective layer and part of the composite package body as a package body.

16 Claims, 8 Drawing Sheets

(51) Int. Cl.
    *H01L 33/46*     (2010.01)
    *H01L 33/60*     (2010.01)
    *H01L 33/54*     (2010.01)

(52) U.S. Cl.
    CPC ...... *H01L 33/54* (2013.01); *H01L 2933/0025* (2013.01); *H01L 2933/0033* (2013.01); *H01L 2933/0058* (2013.01)

(56) References Cited

U.S. PATENT DOCUMENTS

| | | | |
|---|---|---|---|
| 9,209,328 | B2 | 12/2015 | Weidner et al. |
| 9,490,396 | B2 | 11/2016 | Weidner et al. |
| 2009/0250709 | A1* | 10/2009 | Chang .................. H01L 33/642 257/88 |
| 2010/0029023 | A1 | 2/2010 | Neff et al. |
| 2010/0127365 | A1* | 5/2010 | Galera ................ H01L 23/3114 257/676 |
| 2012/0056228 | A1 | 3/2012 | Horng et al. |
| 2012/0149138 | A1 | 6/2012 | Su et al. |
| 2012/0199843 | A1* | 8/2012 | Heikman ................ H01L 33/60 257/76 |
| 2012/0305957 | A1 | 12/2012 | Gandhi et al. |
| 2013/0187178 | A1* | 7/2013 | Tischler .................. H01L 33/50 257/88 |
| 2013/0240935 | A1 | 9/2013 | Jäger et al. |
| 2013/0341747 | A1* | 12/2013 | Lin ..................... H01L 31/0232 257/432 |
| 2014/0168988 | A1* | 6/2014 | Petersen ................ H01L 33/505 362/293 |
| 2015/0137162 | A1* | 5/2015 | Sabathil ................ H01L 33/52 257/98 |
| 2015/0295141 | A1* | 10/2015 | Schwarz ................ H01L 33/64 362/296.01 |

FOREIGN PATENT DOCUMENTS

| | | |
|---|---|---|
| CN | 102779900 A | 11/2012 |
| CN | 103031008 A | 4/2013 |
| DE | 102009036621 A1 | 2/2011 |
| DE | 102010003321 A1 | 9/2011 |
| DE | 102010025319 A1 | 12/2011 |
| DE | 102010046257 A1 | 3/2012 |
| DE | 102012104035 A1 | 11/2013 |
| EP | 1416545 A2 | 5/2004 |
| TW | 201143174 A | 12/2011 |

\* cited by examiner

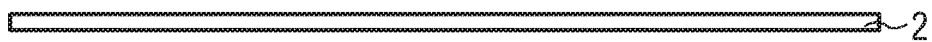
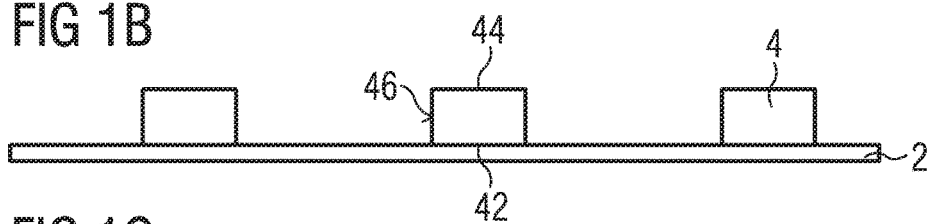
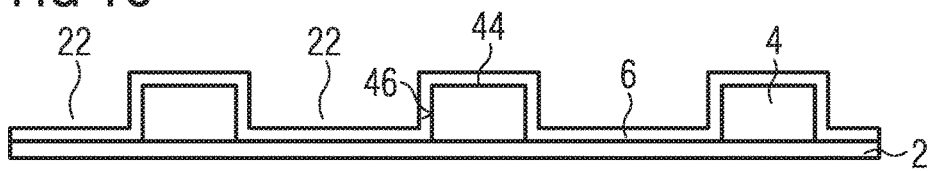
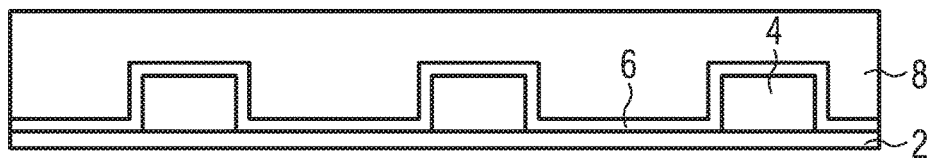
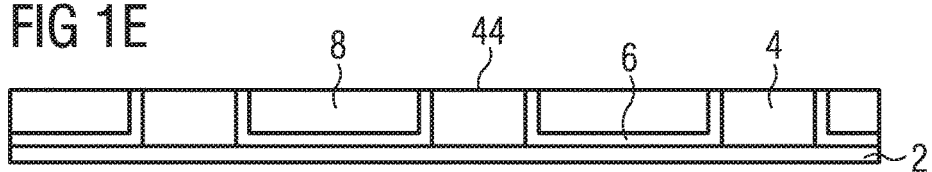
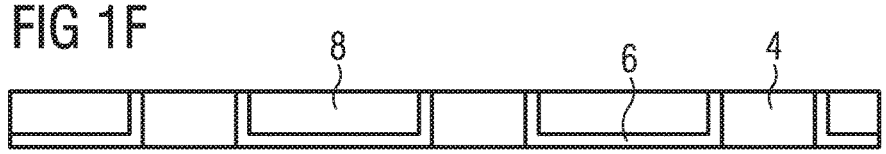
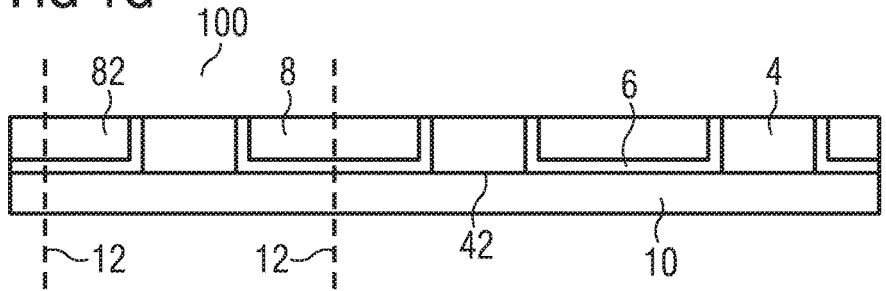

METHOD FOR PRODUCING OPTOELECTRONIC SEMICONDUCTOR DEVICES

This patent application is a national phase filing under section 371 of PCT/EP2014/072775, filed Oct. 23, 2014, which claims the priority of German patent application 10 2013 112 886.6, filed Nov. 21, 2013, each of which is incorporated herein by reference in its entirety.

TECHNICAL FIELD

Embodiments of the present invention relate to a method for producing optoelectronic semiconductor devices and to an optoelectronic semiconductor device.

BACKGROUND

For semiconductor devices such as light-emitting diodes designs are known in which the semiconductor chips provided to generate radiation are mounted in prefabricated housings. Such designs can only be miniaturized with difficulty in order to produce particularly compact light-emitting diodes.

A solution to this problem known from the prior art consists of forming a housing body composite which is disposed between semiconductor chips disposed in the manner of a matrix. The housing body composite can be produced, e.g., by means of a casting process. In a subsequent method step, the housing body composite is separated into a plurality of optoelectronic semiconductor devices and so each separated semiconductor device comprises at least one semiconductor chip and a part of the housing body composite as a housing body.

The problem arises in this case that the housing body composite and therefore also the housing bodies formed from the housing body composite are highly absorbent, that is to say they are substantially black. This is disadvantageous when using semiconductor chips which emit a large amount of light via their side flanks since this light impinges on the housing body and is immediately absorbed.

Furthermore, it is disadvantageous that in the case of semiconductor devices which comprise a conversion layer disposed downstream of the semiconductor chip, by scattering in the conversion layer, light impinges on the adjoining housing body and is likewise absorbed to a considerable extent.

One possible solution to the problem consists of forming connecting elements, which are formed by metallization and serve to contact the semiconductor chip, with as large a surface as possible and in this way covering the light-absorbing regions of the housing body to the greatest possible extent. However, with such a procedure a suitable metal, such as, e.g., silver, must be used, which is not corrosion-stable. This requires the formation of an additional passivation layer, e.g., by deposition of silicon dioxide or parylene. Furthermore, it is necessary for the radiation exit surface to be kept free of the reflective connecting element, which makes an additional structuring step necessary. In addition to the difficulties of this procedure presented, such metallization also does not solve the problem described above that light emitted through side flanks of the semiconductor chip is absorbed by the housing body.

SUMMARY OF THE INVENTION

Embodiments of the invention provide a method of production by which optoelectronic semiconductor devices with a compact design and a high level of out coupling efficiency can be produced. Furthermore, a semiconductor device such as this is to be provided.

In particular, it is an object to prevent to the greatest possible extent the absorption of light by the mechanisms presented above.

A method for producing a plurality of optoelectronic semiconductor devices is provided. According to at least one embodiment of the method, the method includes a step in which an auxiliary carrier is provided. The auxiliary carrier can be flexible, e.g., a foil, or rigid.

According to at least one embodiment of the method, the method includes a step in which a plurality of semiconductor chips are attached to the auxiliary carrier. The preferably optoelectronic semiconductor chips are spaced apart from one another in a lateral direction. At this point and hereinunder, a lateral direction is understood to be a direction parallel to a main extension plane of the auxiliary carrier. For example, the auxiliary carrier can be formed as an adhesive foil to which the semiconductor chips adhere. However, the plurality of semiconductor chips does not necessarily have to be disposed directly on the auxiliary carrier. It is sufficient that the semiconductor chips are disposed, e.g., on an adhesive layer which covers the auxiliary carrier and so they are attached at least indirectly to the auxiliary carrier.

According to at least one embodiment of the method, the method includes a step in which a reflective layer is formed at least in regions between the semiconductor chips. The reflective layer is formed on a side of the auxiliary carrier facing the semiconductor chips, preferably directly on the auxiliary carrier. Preferably, the reflective layer has a thickness between 10 μm and 150 μm, particularly preferably between 50 μm and 100 μm. It is also preferable for the reflective layer to comprise scatter particles. These can be embedded in a matrix. The reflective layer can comprise scatter particles, e.g., of $TiO_2$, $Al_2O_3$ or ZnO (e.g., with a size between 0.05 and 5 μm, preferably between 0.1 and 1 μm). These can be embedded e.g. in a matrix material such as silicone or polysilazane, at particle concentrations between 2 and 50%, typically around 20%.

The semiconductor chips comprise in particular a semiconductor body with an active region provided to generate radiation. The semiconductor body, in particular the active region, contains, e.g., a III-V compound semiconductor material. Furthermore, the semiconductor chip comprises in particular a carrier on which the semiconductor body is disposed. For example, the carrier is a growth substrate for the semiconductor layers of the semiconductor body. Alternatively, the carrier is something other than a growth substrate for the semiconductor layers of the semiconductor body. In this case, the carrier serves to mechanically stabilize the semiconductor body and so the growth substrate is not required for this purpose and can be removed.

A semiconductor chip in which the growth substrate is removed is also referred to as a thin-film semiconductor chip.

According to at least one embodiment of the method, the method includes a step in which a housing body composite is formed which is disposed at least in regions between the semiconductor chips. In this way, at least parts of the reflective layer are disposed between the auxiliary carrier and the housing body composite, whereby, in the finished component, absorption of light which impinges on the housing body from a side of the auxiliary carrier facing away from the semiconductor chips is prevented. It is preferable that a housing body composite is formed which is contiguous over a plurality of or over all the semiconductor chips, in particular a housing body composite which extends over a plurality of or over all the semiconductor chips.

The housing body composite can be produced in particular by means of a casting process. The expression casting process includes all production methods in which a molding compound is introduced into a specific mold and in particular is subsequently hardened. In particular, the expression casting process includes casting, injection molding, transfer molding and compression molding. The housing body composite is preferably formed by compression molding or by a film assisted transfer molding.

The housing body composite can comprise filled or non-filled casting resins (e.g., epoxy resins or silicones). A filling level can be between 70% and 90%, preferably between 75% and 85%, typically 80%. The housing body composite can have a thickness between 50 µm and 500 µm, preferably between 100 µm and 200 µm, typically around 150 µm.

For example, the housing body composite is formed by a black material. For example, the housing body composite can contain or consist of a black epoxy material. Owing to its wide distribution in the electronics field, such a material is available at a particularly reasonable cost and is characterized by good processability.

The housing body composite and therefore also the housing bodies formed from the housing body composite in a subsequent method step are radiopaque and in particular absorbent especially for the radiation to be detected or emitted by the semiconductor chip during operation of the semiconductor device.

In the method step presented, the reflective layer is connected in a form-fitting manner to the casting material used during formation of the housing body composite.

According to at least one embodiment of the method, the method includes a step in which the auxiliary carrier is removed, e.g., by being delaminated.

According to at least one embodiment of the method, the method comprises a step in which the housing body composite is separated into a plurality of optoelectronic semiconductor devices, wherein each semiconductor device has at least one semiconductor chip, a part of the reflective layer and a part of the housing body composite as a housing body.

The housing bodies are produced from the housing body composite only during separation and therefore at a time at which the semiconductor chips are already located in the housing body. A result of the separation of the housing body composite is that at least regions of the lateral surfaces of the resulting optoelectronic semiconductor devices are not covered by the reflective layer, that is to say there is no reflective layer thereon.

According to at least one embodiment of the method, a forming material used during formation of the housing body composite is applied in such a way that it covers the lateral surfaces of the semiconductor chips and/or the rear sides of the semiconductor chips and/or the reflective layer, in each case at least partially, preferably completely. During application of the forming material, the semiconductor chips and the reflective layer are already disposed on the auxiliary carrier.

In this case and hereinunder, lateral surfaces of the semiconductor chips are understood to be those end surfaces of the semiconductor chips which define said chips in a lateral direction, that is to say in a direction parallel to a main extension plane of the auxiliary carrier. Rear sides of the semiconductor chips are understood to be sides of the semiconductor chip which extend facing away from the auxiliary carrier and preferably substantially in parallel with the main extension plane of the auxiliary carrier.

According to at least one embodiment of the method, the method includes a step in which, after removal of the auxiliary carrier, a conversion layer is formed and each of the separated semiconductor devices comprises a part of the conversion layer. The conversion layer is preferably formed on a side of the housing body composite on which the auxiliary carrier was disposed before it was removed. That is to say, the conversion layer substantially takes the place of the auxiliary carrier.

The conversion layer is in particular formed to convert primary radiation produced in the semiconductor chips and having a first wavelength into secondary radiation having a longer wavelength different from the first wavelength. For example, the semiconductor device is provided to generate mixed light, in particular mixed light which appears to be white to the human eye.

As described above, the reflective layer is formed at least in regions between the semiconductor chips. According to at least one embodiment of the method, lateral surfaces and/or rear sides of the semiconductor chips remain substantially uncovered. This is advantageous in that covering the auxiliary carrier with the reflective layer in regions between the semiconductor chips is sufficient. Nevertheless, since parts of the reflective layer can come into contact, e.g., with lateral flanks of the semiconductor chip, this can mean that the lateral surfaces and rear sides of the semiconductor chips remain uncovered by the reflective layer except for at least 10% of their surface.

According to at least one embodiment, the reflective layer is also formed on lateral surfaces and rear sides of the semiconductor chips. It is thereby achieved that light which passes through said lateral surfaces of the semiconductor chip also impinges on the reflective layer and is not absorbed by the housing body. This desired effect also occurs when the reflective layer covers said sides over at least 80% of their surface, preferably at least 90% of their surface.

According to at least one embodiment of the method, the reflective layer is formed by spray coating. In this case, a thin reflective layer is deposited over the surface, this layer comprising a matrix material, such as silicone or polysilazane, and reflective particles embedded therein, particularly particles of titanium dioxide. When using this method, the semiconductor chips are also covered on their rear side by the reflective layer. Advantageously, application of the reflective layer by means of spray coating is selected only when the housing body composite is formed by compression molding since in this case the relatively thickly applied forming material must be ground back in order to expose the rear side of the semiconductor chips for contact therewith.

According to at least one embodiment of the method, the reflective layer is formed owing to the fact that the auxiliary carrier with the plurality of semiconductor chips disposed thereon is immersed in a medium, particularly a liquid, which comprises reflective pigments or particles. Non-metallic particles, such as, e.g., titanium dioxide particles, are also suitable. The auxiliary carrier is preferably immersed in the medium only with the side on which the semiconductor chips are disposed. Excess material then drops off. The side of the auxiliary carrier which faces away from the semiconductor chips is either not immersed in the medium at all or is protected against contact with the medium.

According to at least one embodiment of the method, at least regions of the auxiliary carrier are covered with an electrically conductive seed layer prior to attachment of the semiconductor chips. The reflective layer is electrophoretically deposited at least on partial portions of the seed layer, preferably on the whole seed layer. The seed layer can contain a metal or consist of a metal and preferably has a thickness between 20 nm and 100 nm, particularly preferably between 40 nm and 60 nm, typically 50 nm.

For example, the seed layer can cover the whole surface of the auxiliary carrier. For this purpose, the thickness of the seed layer is preferably selected to be so small that an adhesive force of the auxiliary carrier is not substantially impaired. Alternatively, coating can be carried out using a mask with a seed layer made from aluminum, wherein seed layer apertures are provided in the regions in which the semiconductor chips are to be attached. This procedure has the advantage that the auxiliary carrier retains its adhesive force in the regions of the semiconductor chips.

If the semiconductor chips are sufficiently isolated from the auxiliary carrier, e.g., by a passivation layer on the front side of the semiconductor chips, by an isolating carrier material of the semiconductor chips or specifically when using semiconductor chips which comprise a carrier made of sapphire, in the case of the electrophoretic coating, only the auxiliary carrier is coated in the regions between the semiconductor chips but not the semiconductor chips on the side flanks or rear sides thereof. Since, therefore, it is no longer necessary to remove the reflective layer from the rear sides of the semiconductor chips, the formation of the housing body composite can be effected both by compression molding and also by film assisted transfer molding.

In contrast, if the semiconductor chips are not sufficiently isolated from the auxiliary carrier and the seed layer applied thereto (e.g., if a passivation layer is absent from the front side of the semiconductor chips) then, during the electrophoretic coating, the lateral flanks and the rear sides of the semiconductor chips are also covered with the reflective layer by reason of the electrically conductive connection to the seed layer. In this case, the formation of the housing body composite by compression molding is an option since in that case the rear sides of the semiconductor chips are exposed separately.

According to at least one embodiment of the method, the method includes a step in which a seed layer is formed only after the semiconductor chips have been attached to the auxiliary carrier. The seed layer covers both the auxiliary carrier in the regions between the semiconductor chips and also the lateral surfaces and/or the rear sides of the semiconductor chips. The reflective layer is again electrophoretically deposited at least on partial portions of the seed layer, preferably on the whole seed layer.

It is generally the case that in the event that the rear sides of the semiconductor chips remain uncovered by the reflective layer, the formation of the housing body composite can take place both by compression molding and also by film assisted transfer molding. In contrast, in the case where the rear sides of the semiconductor chips are covered by the reflective layer, the use of a film assisted transfer molding process is not an option since in that case there is no separate back-grinding of the housing body composite and the reflective layer on the rear side of the semiconductor chips is therefore not removed. There is an exception when rear-side contact of the semiconductor chips can readily be dispensed with since then the covering of the rear sides of the semiconductor chips with a reflective layer is innocuous. However, it should be noted that the rear-side covering of the semiconductor chips with the reflective layer leads to an increase in thermal resistance which is undesirable in many cases.

The use of a reflective layer comprising scatter particles has the advantage over the metal mirrors known from the prior art of corrosion stability while at the same time having a very high level of reflectivity. Furthermore, the additional structuring step required in the prior art and described in the introduction is omitted.

In the case of electrophoretic deposition of the reflective layer, the scatter particles contained therein are fixed only upon formation of the housing body composite. It is also to be noted that the thickness of the reflective layer must be adjusted such that possible penetration of the forming material does not lead to a reduction in the reflective properties.

According to at least one embodiment of the method, the reflective layer on the rear sides of the semiconductor chips, which has no contact with the housing body composite and is therefore not fixed, is removed, e.g., by washing, wiping or water jet cleaning.

An optoelectronic semiconductor device comprises, according to at least one embodiment, a mounting surface and a radiation exit surface opposite to the mounting surface. Furthermore, the semiconductor device comprises a semiconductor chip provided to generate and/or receive radiation.

According to at least one embodiment of the optoelectronic semiconductor device, the semiconductor device comprises a housing body which surrounds the semiconductor chip in a lateral direction.

According to at least one embodiment of the optoelectronic semiconductor device, a reflective layer which comprises scatter particles, in particular of titanium dioxide, is disposed at least on regions of the housing body.

According to at least one embodiment of the optoelectronic semiconductor device, lateral surfaces of the housing body are not covered by the reflective layer.

According to at least one embodiment of the optoelectronic semiconductor device, the semiconductor device comprises a conversion layer, wherein the reflective layer is disposed at least in regions between the conversion layer and the housing body.

The method described above for producing optoelectronic semiconductor devices is particularly suitable for the production of the optoelectronic semiconductor device. Therefore, features stated in conjunction with the method can also be used for the semiconductor device, and vice-versa.

BRIEF DESCRIPTION OF THE DRAWINGS

Further features, embodiments and developments will be apparent from the following description of the exemplified embodiments in conjunction with the figures.

Identical, similar elements or elements which act in an identical manner are provided with the same reference numerals in the figures.

Figure 2A:
Figure 2B:
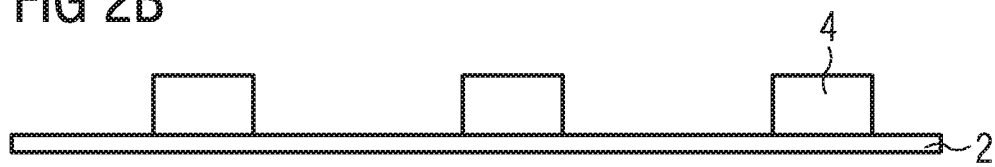
Figure 2C:
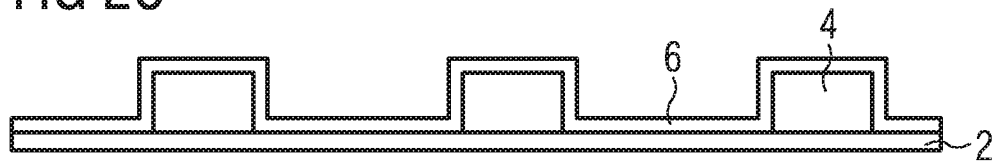
Figure 2D:
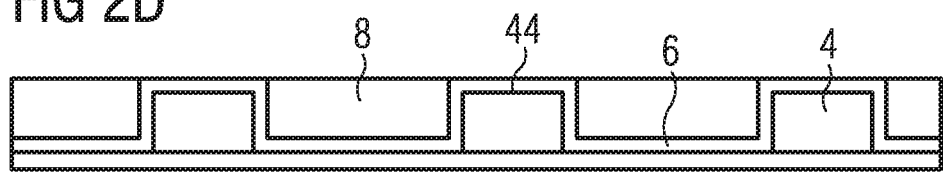
Figure 2E:
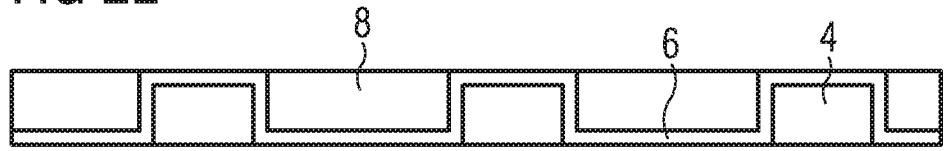
Figure 2F:
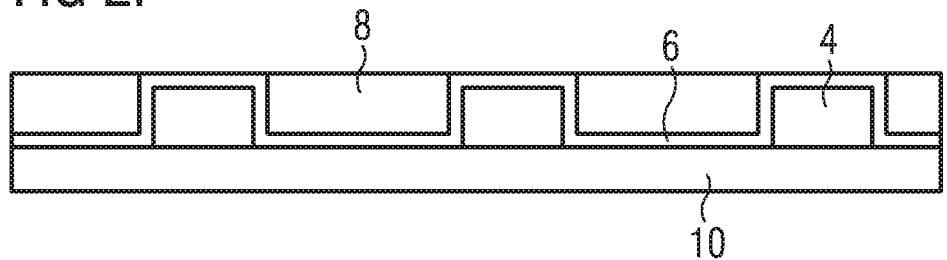

The figures and the size ratios of the elements with respect to each other, as illustrated in the figures, are not to be considered as being to scale. Rather, individual elements and in particular layer thicknesses, can be illustrated excessively large for improved illustration and/or for improved understanding.

In the figures:

FIGS. 1A to 1G, 2A to 2F, 3A to 3G, 4A to 4F, 5A to 5G, 6A to 6G, 7A to 7F and 8A to 8G show an exemplified embodiment respectively, for a method for producing optoelectronic semiconductor devices with the aid of intermediate steps each illustrated in a schematic sectional view.

DETAILED DESCRIPTION OF ILLUSTRATIVE EMBODIMENTS

FIGS. 1A to 1G show a first exemplified embodiment for a method for producing a plurality of optoelectronic semiconductor devices. As shown in FIG. 1A, an auxiliary carrier 2 is first provided. For example, a self-adhesive foil is suitable for the auxiliary carrier 2. Alternatively, the attachment of the semiconductor chips can also be effected by means of a temporary adhesive.

In the method step illustrated in FIG. 1B, a plurality of semiconductor chips 4 are attached directly to the auxiliary carrier 2. The semiconductor chips 4 are disposed in a matrix-like manner and in a lateral direction, that is to say spaced apart from one another in a direction parallel to the main extension plane of the auxiliary carrier 2.

The following description is given by way of example for radiation-emitting semiconductor devices. The semiconductor chips are, e.g., luminescent diode semiconductor chips, such as light-emitting diode semiconductor chips. However, in a deviation therefrom, the semiconductor devices can also be provided to receive radiation and, e.g., comprise a semiconductor chip formed as a photodiode.

The semiconductor chips 4 extend in a vertical direction between a front side 42 and a rear side 44. Furthermore, the semiconductor chips 4 have lateral surfaces 46. The semiconductor chips 4 are disposed on the auxiliary carrier 2 in such a way that the front side 42 faces the auxiliary carrier 2.

In the method step shown in FIG. 1C, a reflective layer 6, which contains scatter particles of titanium dioxide, is applied by spray coating to the side of the auxiliary carrier 2 to which the semiconductor chips 4 are attached. The reflective layer 6 covers both the regions 22 of the auxiliary carrier 2 which lie between the semiconductor chips 4, and also lateral surfaces 46 and rear sides 44 of the semiconductor chips.

In the following method step illustrated in FIG. 1D, a housing body composite 8 is produced by compression molding, which is disposed on the reflective layer 6 and fills the regions between adjacent semiconductor chips 4.

In the following method step illustrated in FIG. 1E, the housing body composite 8 is thinned from the side facing away from the auxiliary carrier 2, e.g., by means of a mechanical method such as grinding, and so the rear sides 44 of the semiconductor chips are exposed.

In the method step illustrated in FIG. 1F, the auxiliary carrier 2 is removed by delamination. Taking its place in FIG. 1G is a conversion layer 10 which, in regions, adjoins the front sides 42 of the semiconductor chips and with the rest of its surface adjoins the reflective layer 6.

For the purpose of separation into semiconductor devices 100, the housing body composite 8 can be severed along separation lines 12. This can take place, e.g., mechanically, such as by means of sawing, chemically, e.g., by etching and/or by means of coherent radiation, such as by laser ablation. Each semiconductor device 100 has at least one semiconductor chip 4, a part of the reflective layer 6 and a part of the housing body composite as a housing body 82.

The exemplified embodiment illustrated in FIGS. 2A to 2F corresponds substantially to the exemplified embodiment described in conjunction with FIGS. 1A to 1G. In contrast thereto, instead of over-molding the semiconductor chips 4 on the rear side 44 thereof and subsequently thinning the housing body composite 8, the housing body composite 8 is already formed such that the rear sides 44 of the semiconductor chips 4 are exposed (see FIG. 2D). For this purpose, e.g., film assisted transfer molding is used which leads to the housing body composite 8 and the reflective layer 6 disposed on the rear sides 44 of the semiconductor chips adjoining one another in a flush manner.

FIGS. 1A to 1G and 2A to 2F illustrate the same method steps which are also carried out when the reflective layer is not produced by spray coating but rather by the auxiliary carrier 2 with the plurality of semiconductor chips 4 being immersed in a liquid which comprises scatter particles.

The contacting of the finished optoelectronic devices 100, e.g., by metallic connecting elements or bond wires, is not illustrated in detail in the figures.

Figure 3A:
Figure 3B:
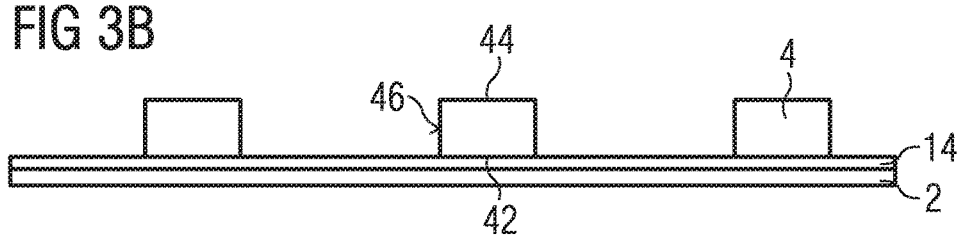

In FIGS. 3A to 3G, an exemplified embodiment of the method is illustrated in which the reflective layer 6 is formed by electrophoresis. For this purpose, an electrically conductive layer 14, which has a thickness between 1 and 10 nm, preferably between 4 and 7 nm, is vapor-deposited on the auxiliary carrier 2 (FIG. 3A). In the method step illustrated in FIG. 3B, the semiconductor chips 4 are attached to the conductive seed layer 14. In the present exemplified embodiment, the lateral surface 46 of the semiconductor chips 4 are electrically isolated from the conductive seed layer 14. This can be attributed to the fact that a passivation layer (not illustrated) is disposed on the front side 42 of the semiconductor chips 4 and acts as an isolation layer between the seed layer 14 and the rest of the semiconductor chip 4. Furthermore, the electrical isolation can be attributed to the fact that the semiconductor chips 4 have an isolating carrier element, e.g., of sapphire, and so only regions of the semiconductor chips 4 which take up little space—if any regions at all—are connected to the seed layer 14 in an electrically conductive manner.

Figure 3C:
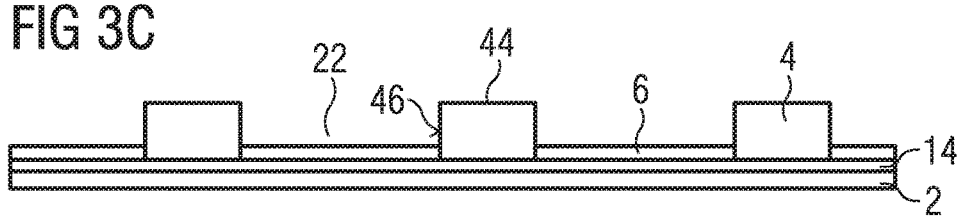
Figure 3D:
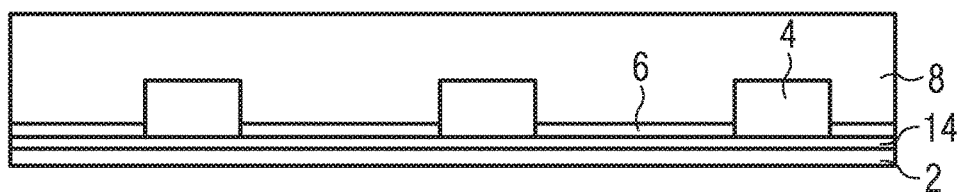

Owing to the fact that the lateral surfaces 46 are either partially or fully electrically isolated from the seed layer 14, the lateral surfaces 46 remain uncovered during the electrophoretic application of the reflective layer 6 illustrated in FIG. 3C. In this way, the reflective layer 6 is disposed only between the auxiliary carrier 2 and the housing body composite 8. In the method step shown in FIG. 3E, the seed layer 14 is removed together with the auxiliary carrier 2 and so the conversion layer 10 is subsequently formed directly on the reflective layer 6.

Figure 3E:
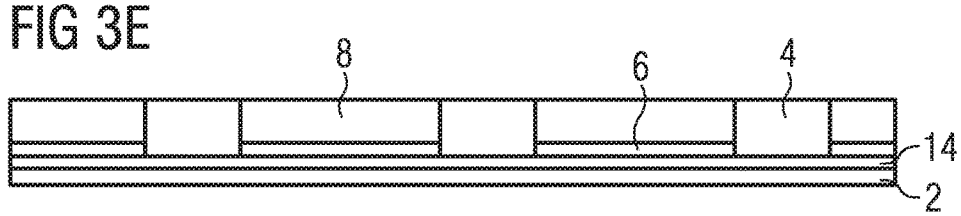
Figure 3F:
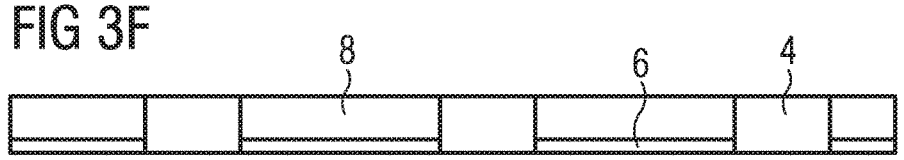
Figure 3G:
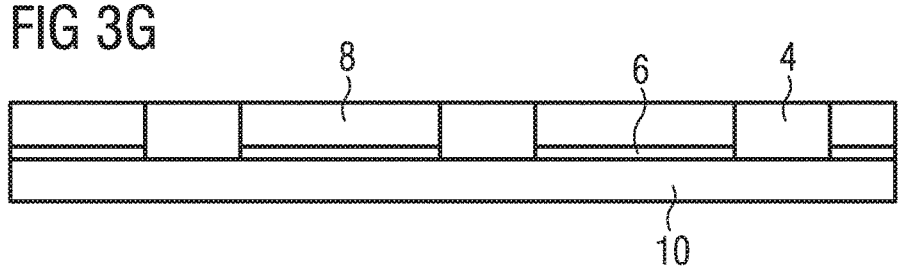
Figure 4A:
Figure 4B:
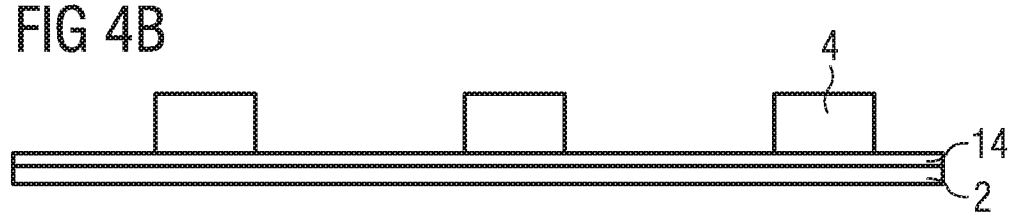
Figure 4C:
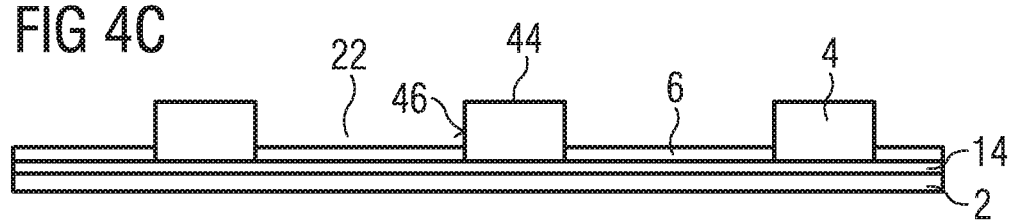
Figure 4D:
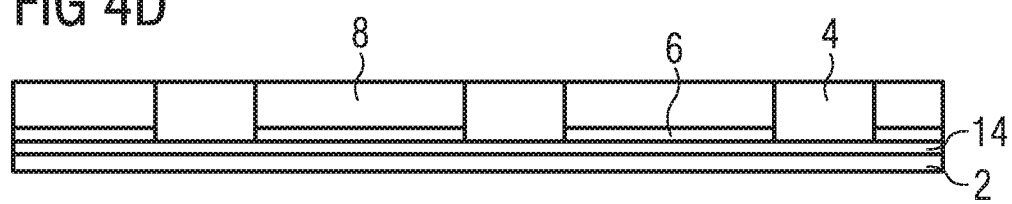
Figure 4E:
Figure 4F:
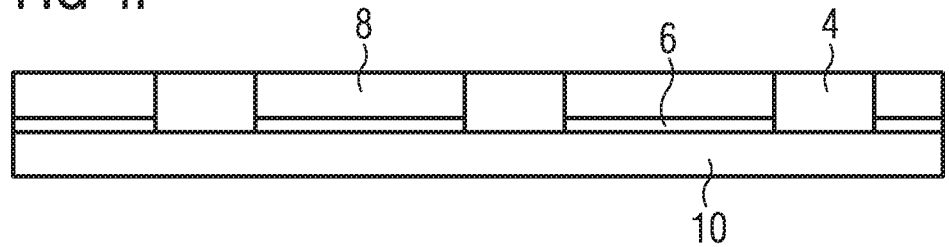

FIGS. 4A to 4F show an exemplified embodiment of the method in which, in contrast to the exemplified embodiment shown in FIGS. 3A to 3G, a film assisted transfer molding process is used, whereby it is possible to dispense with the grinding process shown in FIG. 3E.

Figure 5A:
Figure 5B:
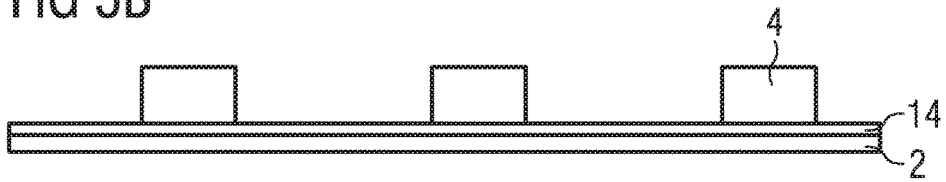
Figure 5C:
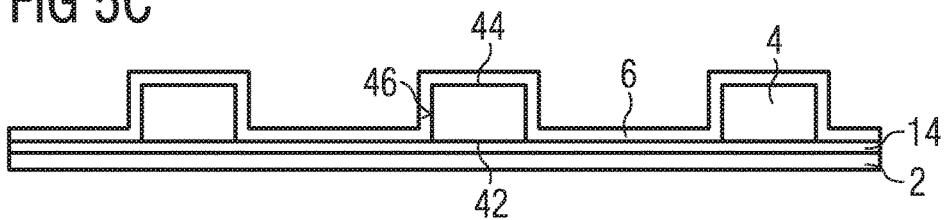
Figure 5D:
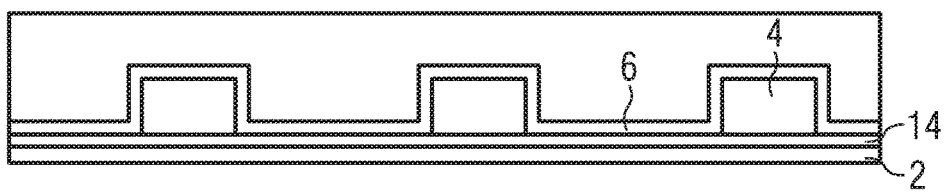
Figure 5E:
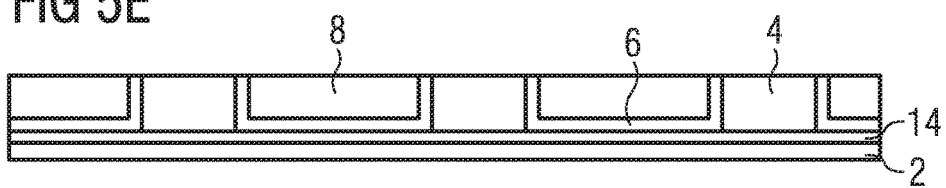
Figure 5F:
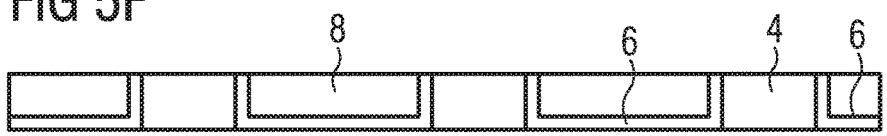
Figure 5G:
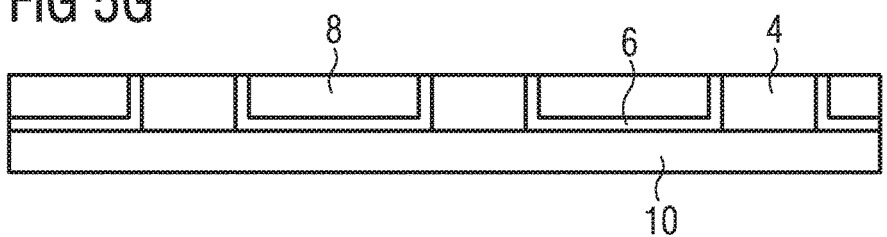

FIGS. 5A to 5G show an exemplified embodiment of the method which substantially corresponds to the exemplified embodiment shown in FIGS. 3A to 3G and likewise includes a method step in which the reflective layer 6 is applied by electrophoresis (FIG. 5C). In contrast to the exemplified embodiment shown in FIGS. 3A to 3G, the lateral surfaces 46 of the semiconductor chips 4 are electrically connected to the seed layer 14, either because the semiconductor chip 4 comprises no or at least only a very thin passivation layer, which does not result in a sufficient isolation of the lateral surfaces 46. In this way, the reflective layer 6 applied by electrophoresis also covers the lateral surfaces 46 and the rear sides 44 of the semiconductor chips 4.

The use of a film assisted transfer molding process is not advantageous in this situation because in this case no separate thinning process is carried out and by reason of the covering of the rear sides 44 of the semiconductor chips 4 with the reflective layer 6, contacting of the semiconductor chips 4 is possible only from the front side 42.

Figure 6A:
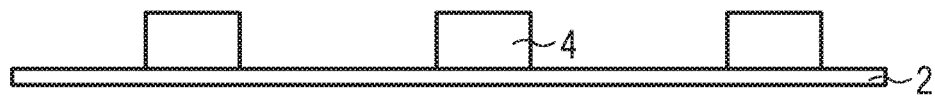
Figure 6B:
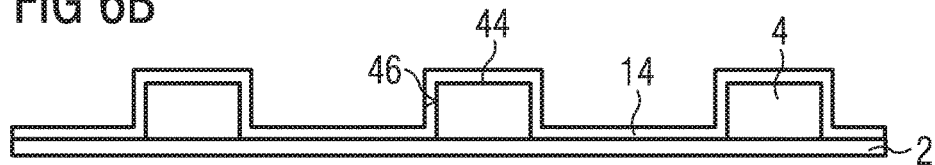
Figure 6C:
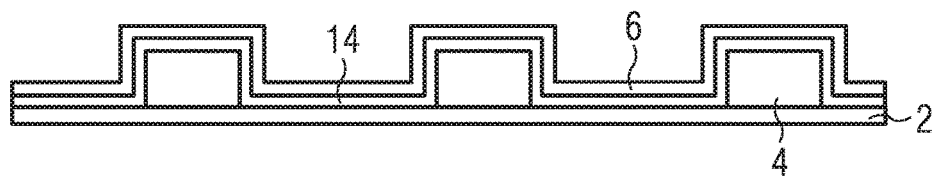
Figure 6D:
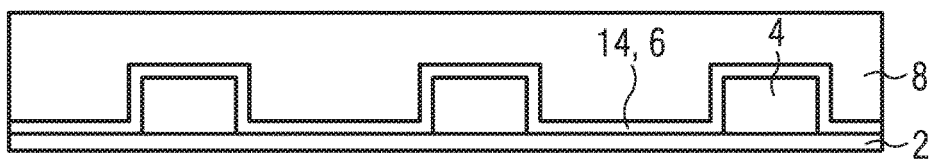
Figure 6E:
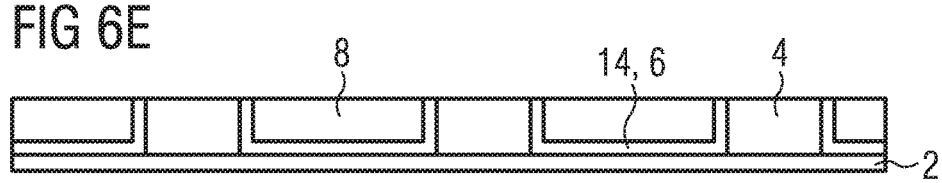
Figure 6F:
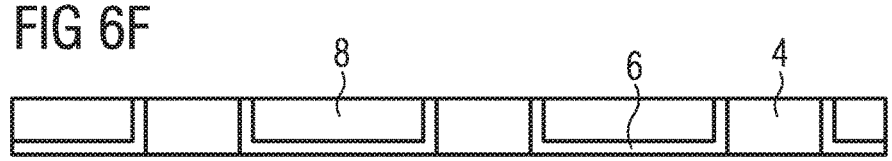
Figure 6G:
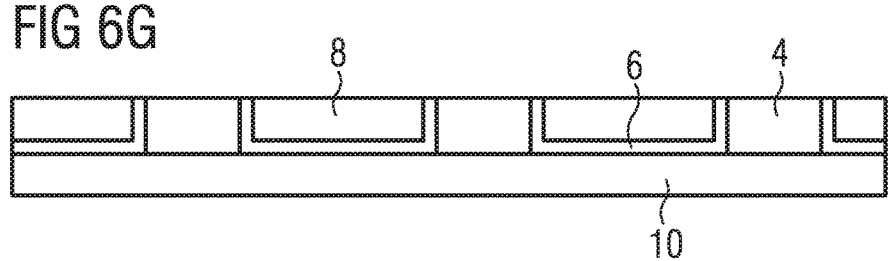

In FIGS. 6A to 6G, a further exemplified embodiment of the method is illustrated in which the reflective layer 6 is likewise applied to the seed layer 14 by electrophoresis. However, in contrast to the previous exemplified embodiments the seed layer 14 is applied only when the semiconductor chips 4 are already attached to the auxiliary carrier 2 (FIG. 6B). In this way, the seed layer 14 also covers the lateral surfaces 46 and the rear sides 44 of the semiconductor chips 4. Therefore, the reflective layer 6 covers the whole surface of the seed layer 14 (FIG. 6C). For the sake of simplification, FIGS. 6D and 6E do not show the two afore-mentioned layers separately but instead they appear as a single layer. During formation of the housing body composite 8 and the thinning thereof as shown in the preceding exemplified embodiments, the method step shown in FIG. 6F, in which the auxiliary carrier 2 is removed, differs from the preceding exemplified embodiments in that the seed layer 14 is removed together with the auxiliary carrier 2 only in the regions in which it adjoins the auxiliary carrier 2. In the regions of the lateral surfaces 46 of the semiconductor chips, it continues to be retained. As shown in FIG. 6G, in a subsequent method step the conversion layer 10 is again formed in such a way that it adjoins the reflective layer 6.

Figure 7A:
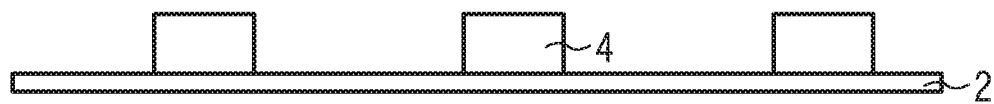
Figure 7B:
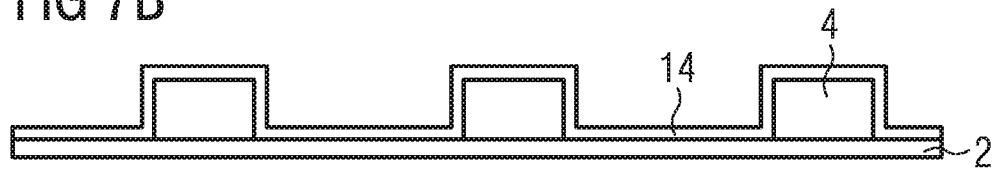
Figure 7C:
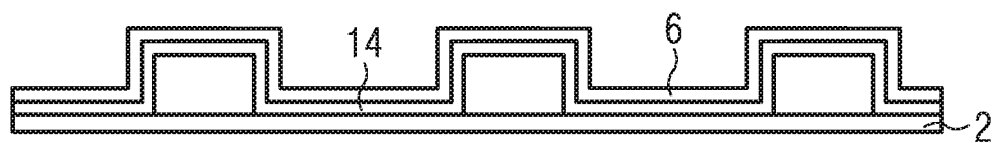
Figure 7D:
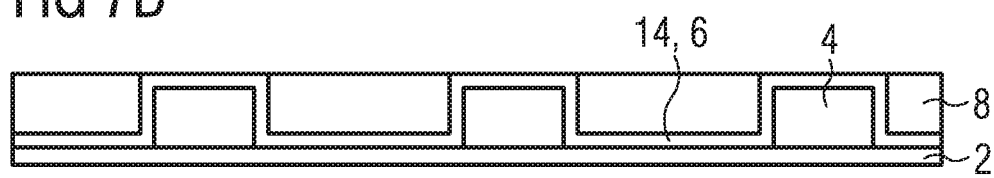
Figure 7E:
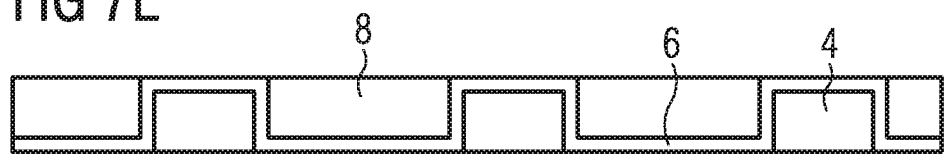
Figure 7F:
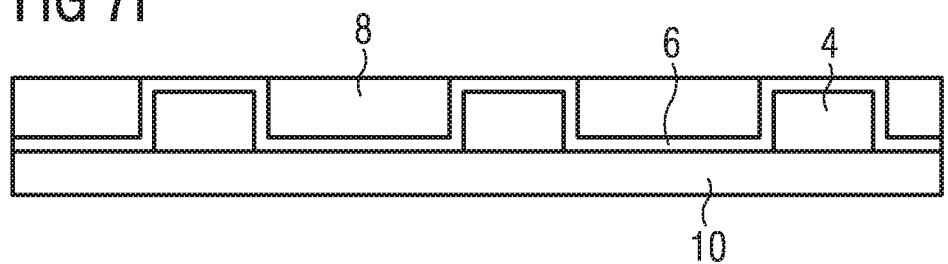
Figure 8A:
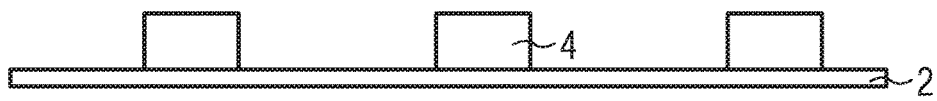
Figure 8B:
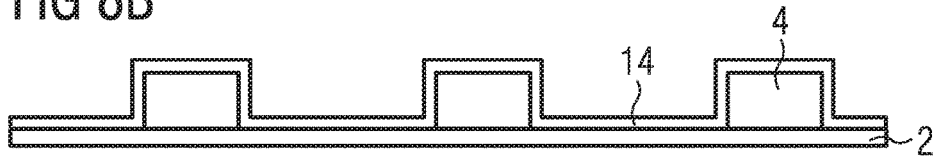
Figure 8C:
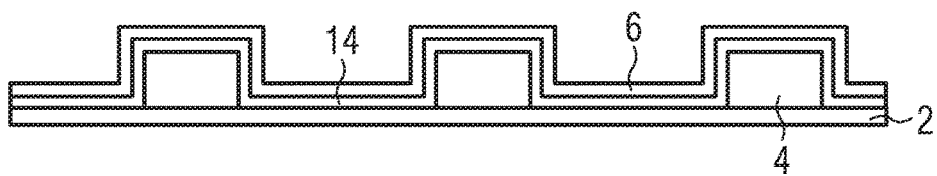
Figure 8D:
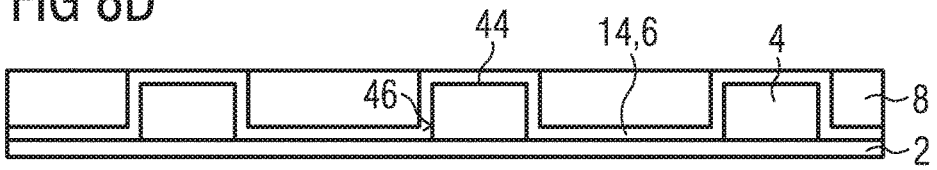
Figure 8E:
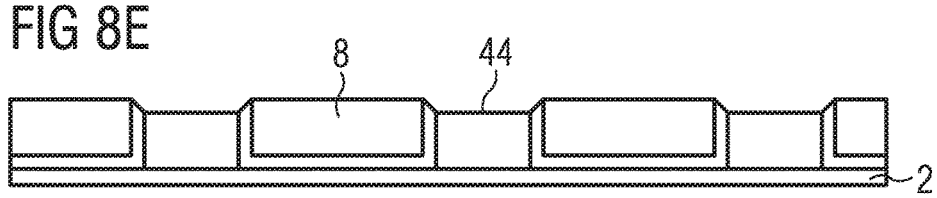
Figure 8F:
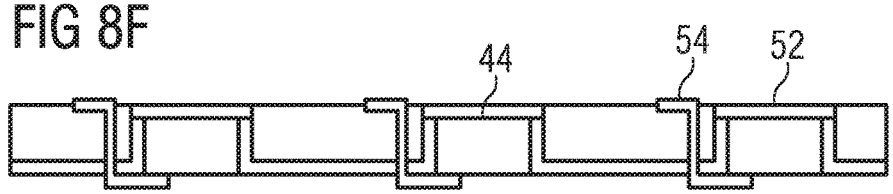
Figure 8G:
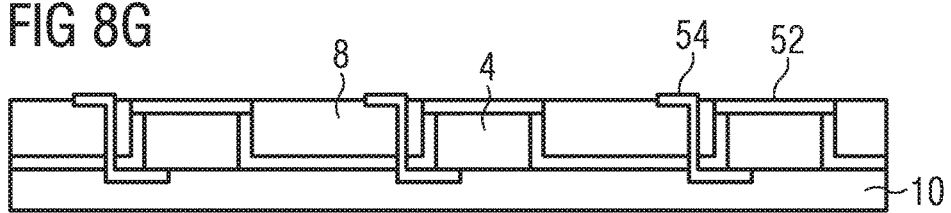

FIGS. 7A to 7F correspond to the exemplified embodiment shown in FIGS. 6A to 6G, with the difference being that a film assisted transfer molding process is used, whereby it is again possible to dispense with back-grinding of the housing body composite 8 (see FIG. 7D). In general, the method shown in FIGS. 7A to 7F can only be applied advantageously in a situation in which electrical contacting of the semiconductor chips from the rear side is not required because the reflective layer 6 is formed in an isolating manner.

FIGS. 8A to 8G show a further exemplified embodiment of the method which is carried out substantially analogously to the exemplified embodiment shown in FIGS. 7A to 7F. In contrast, parts of the seed layer 14 and of the reflective layer 6 are removed in the region of the rear sides 44 of the semiconductor chips (see FIG. 8E) in that said layers are dissolved away, e.g., by water jet cleaning. In a similar way, removal can be effected by washing or wiping of the side of the housing body composite 8 facing away from the auxiliary carrier 2. This can also be facilitated by the reflective layer 6 not terminating flush with the housing body composite 8 in the region of the rear sides 44 of the semiconductor chips 4, in contrast to the manner shown in FIG. 8D. It is rather the case that the reflective layer 6 and the seed layer 14 protrude vertically over the housing body composite 8 in these regions, wherein the step height is dependent on a depth at which the semiconductor chips are pressed into the auxiliary carrier 2.

Owing to the fact that, after dissolving away the reflective layer 6 in the regions of the rear sides 44 of the semiconductor chips, these are now exposed, it is possible also to contact the semiconductor chips from the rear side thereof. Front side contacts 54 and rear side contacts 52 are shown by way of example in FIGS. 8F and 8G and can supply the semiconductor chips 4 with electric current.

The invention is not limited by the description made with reference to the exemplified embodiments. Rather, the invention includes any novel feature and any combination of features, including in particular any combination of features in the claims, even if this feature or this combination is itself not explicitly indicated in the claims or exemplified embodiments.

The invention claimed is:

1. A method for producing a plurality of optoelectronic semiconductor devices, the method comprising:
   attaching a plurality of semiconductor chips to an auxiliary carrier, wherein the semiconductor chips are spaced apart from one another in a lateral direction;
   forming a reflective layer in regions between the semiconductor chips;
   forming a housing body composite, which is disposed in regions between the semiconductor chips;
   removing the auxiliary carrier; and
   separating the housing body composite into a plurality of optoelectronic semiconductor devices, wherein each semiconductor device has a semiconductor chip, a part of the reflective layer and a part of the housing body composite as a housing body,
   wherein forming the reflective layer comprises forming the reflective layer only in the regions between the semiconductor chips such that lateral surfaces and rear sides of the semiconductor chips are uncovered by the reflective layer except for at least 10% of their surface, or
   wherein forming the reflective layer comprises forming the reflective layer on lateral surfaces and rear sides of the semiconductor chips such that at least 80% of the lateral surfaces and rear sides are covered.

2. The method according to claim 1, wherein each semiconductor device has a plurality of semiconductor chips.

3. The method according to claim 1, further comprising forming a conversion layer after removing the auxiliary carrier, wherein each semiconductor device further comprises a portion of the conversion layer.

4. The method according to claim 1, wherein forming the reflective layer comprises forming the reflective layer by spray coating.

5. The method according to claim 1, wherein forming the reflective layer comprises immersing the auxiliary carrier with the plurality of semiconductor chips in a liquid that comprises reflective pigments or particles.

6. The method according to claim 1, wherein regions of the auxiliary carrier are covered with an electrically conductive seed layer, and wherein forming the reflective layer comprises electrophoretically depositing the reflective layer on the seed layer.

7. The method according to claim 1, further comprising forming a seed layer after attaching the semiconductor chips to the auxiliary carrier and before forming the reflective layer, the seed layer covering the auxiliary carrier in the regions between the semiconductor chips and lateral surfaces and rear sides of the semiconductor chips, wherein forming the reflective layer comprises electrophoretically depositing the reflective layer on the seed layer.

8. The method according to claim 1, wherein the semiconductor chips are each free of a material of the housing body composite on a radiation exit surface of the semiconductor devices, which is opposite to a mounting surface.

9. The method according to claim 8, wherein the semiconductor chips are each free of the material of the housing body composite on the mounting surface of the semiconductor devices.

10. The method according to claim 1, wherein forming the housing body composite comprises forming the housing body composite by compression molding or by a film assisted transfer molding process.

11. The method according to claim 1, wherein forming the housing body composite comprises over-molding the semiconductor chips and subsequently thinning the housing body composite so that regions of the semiconductor chips are exposed.

12. An optoelectronic semiconductor device produced by the method according to claim 1, wherein the semiconductor device is a surface emitter and wherein the semiconductor device comprises:
   a semiconductor chip configured to generate and/or receive radiation;
   a housing body that surrounds the semiconductor chip in a lateral direction;
   a seed layer covering lateral surfaces of the semiconductor chip; and
   a reflective layer disposed on the housing body over the seed layer, the reflective layer comprising scatter particles and having physical characteristics of a layer deposited by electrophoresis, wherein lateral surfaces of the housing body are not covered by the reflective layer.

13. An optoelectronic semiconductor device that is a surface emitter, the optoelectronic semiconductor device comprises:
   a semiconductor chip configured to generate and/or receive radiation;
   a housing body that surrounds the semiconductor chip in a lateral direction;
   a seed layer covering lateral surfaces of the semiconductor chip; and
   a reflective layer disposed on the housing body over the seed layer, the reflective layer comprising scatter particles and having physical characteristics of a layer deposited by electrophoresis, wherein lateral surfaces of the housing body are not covered by the reflective layer.

14. The optoelectronic semiconductor device according to claim 13, further comprising a conversion layer, wherein the reflective layer is disposed in regions between the conversion layer and the housing body.

15. The optoelectronic semiconductor device according to claim 13, wherein the housing body comprises a filled casting resin having a filling level between 70% and 90%.

16. A method for producing a plurality of optoelectronic semiconductor devices the method comprising:
   providing an auxiliary carrier;
   attaching a plurality of semiconductor chips to the auxiliary carrier, wherein the semiconductor chips are spaced apart from one another in a lateral direction;
   forming a reflective layer in regions between the semiconductor chips;
   forming a housing body composite that is disposed in regions between the semiconductor chips;
   removing the auxiliary carrier; and
   separating the housing body composite into a plurality of optoelectronic semiconductor devices, wherein each semiconductor device has a semiconductor chip, a part of the reflective layer and a part of the housing body composite as a housing body;
   wherein forming the reflective layer comprises:
   electrophoretically depositing the reflective layer over an electrically conductive seed layer that overlies regions of the auxiliary carrier; or
   forming a seed layer that covers the auxiliary carrier in the regions between the semiconductor chips and lateral surfaces and rear sides of the semiconductor chips and electrophoretically depositing the reflective layer at least on partial portions of the seed layer.

\* \* \* \* \*